United States Patent [19]

Bertotti et al.

[11] Patent Number: 4,910,159

[45] Date of Patent: Mar. 20, 1990

[54] METHOD FOR INCREMENTALLY INCREASING THE COLLECTOR AREA OF A LATERAL PNP TRANSISTOR DURING ELECTRICAL TESTING OF AN INTEGRATED DEVICE ON WAFER

[75] Inventors: Franco Bertotti, Milan; Paolo Ferrari, Gallarate; Mario Foroni, Valeggio sul Mincio; Maria T. Gatti, Milan, all of Italy

[73] Assignee: SGS-Thomson Microelectronics, s.r.l, Italy

[21] Appl. No.: 288,163

[22] Filed: Dec. 22, 1988

[30] Foreign Application Priority Data

Dec. 22, 1987 [IT] Italy .............................. 83683 A/87

[51] Int. Cl.⁴ ............................................ H01L 29/72
[52] U.S. Cl. ..................................... 437/31; 437/170;
  437/32; 437/923; 437/8; 357/46; 357/35;
  357/13
[58] Field of Search ............... 437/31, 170, 51, 32,
  437/923, 172, 8; 25/593; 148/DIG. 162, DIG.
  55; 357/46, 35, 13

[56] References Cited

U.S. PATENT DOCUMENTS

| 3,761,787 | 9/1973 | Davis et al. ................. 437/170 |
| 3,958,267 | 5/1976 | Frederiksen et al. .......... 357/46 |
| 4,071,778 | 1/1978 | Nakagami ..................... 357/35 |
| 4,451,839 | 5/1984 | Nelson ......................... 357/13 |
| 4,646,427 | 3/1987 | Doyle ........................... 357/13 |
| 4,730,127 | 3/1988 | Susak ........................... 357/36 |
| 4,775,884 | 10/1988 | Erdi ............................. 357/13 |
| 4,820,657 | 4/1989 | Hughes et al. ................ 437/172 |

Primary Examiner—Brian E. Hearn
Assistant Examiner—Tuan Nguyen
Attorney, Agent, or Firm—Pollock, Vande Sande & Priddy

[57] ABSTRACT

The collector area of a lateral PNP transistor may be incrementally increased during an electic testing step on wafer of an integrated circuit by purposely forming an auxiliary p-type diffused collector region having fractional dimensions near the primary collector region of the transistor and by permanently shorcircuiting the two regions by means of a "Zener zapping" technique, by forcing a current through the inversely biased base-collector junction utilizing a suitable contact pad connected to the auxiliary collector region to create localized power dissipation conditions sufficient to melt the metal of the respective metal at the adjacent contacts and to form a permanent connection between the two metals. The technique is very useful for adjusting the value of the output current(s) in precision current generating circuits.

2 Claims, 1 Drawing Sheet

METHOD FOR INCREMENTALLY INCREASING THE COLLECTOR AREA OF A LATERAL PNP TRANSISTOR DURING ELECTRICAL TESTING OF AN INTEGRATED DEVICE ON WAFER

BACKGROUND OF THE INVENTION

1. Field of the Invention

The present invention relates to bipolar type analog integrated circuits and, in particular, to the adjustment techniques of the intrinsic characteristics of integrated devices during the fabrication thereof.

2. Discussion of the Prior Art

In many analog integrated circuit applications, for example in TV deflextion circuits, in telecom buzzers, and the like, it is necessary to ensure highly precise output currents of the integrated device. A technique commonly used for satisfying this precision requirement, is that of relying on particularly precise voltage references such as for example Widlar, Zener and similar voltage reference structures, which may be connected to high precision resistors, externally to the integrated circuit. This technique is very expensive.

SUMMARY OF THE INVENTION

These problems of making integrated devices, capable of ensuring an output current of value falling within extremely stringent tolerance limits in respect to a given design value, are efficiently overcome by the present invention which is directed to a technique for adjusting the current delivered by an integrated circuit by modifying the collector area of relevant lateral PNP output transistors during an electrical testing stage of the integrated device itself, performed on the silicon wafer during fabrication.

BRIEF DESCRIPTION OF THE DRAWINGS

The different aspects and advantages of the present invention will become evident through the following description of several preferred embodiments of the invention, with reference also to the accompanying drawings, wherein.

DESCRIPTION OF THE PREFERRED EMBODIMENTS

Figure 1:
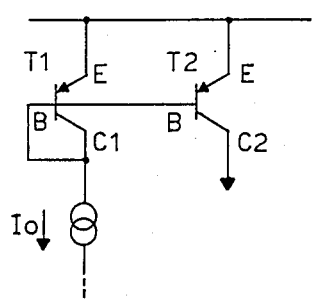
FIG. 1 is a basic circuit diagram of an output current generating stage.

A current generating circuit, as schematically depicted in FIG. 1, is widely used in integrated circuits. Customarily, the circuit utilizes a typical integrated structure for realizing the two lateral PNP transistors T1 and T2 which are used in the circuit of FIG. 1. The integrated structure of the two transistors T1 and T2 is made, in accordance with the present invention, in the form as substantially depicted by a schematic plan view in FIG. 2, wherein the diffusion profiles are indicated by a dash and point line while the relative profiles of the electric contact areas, hidden by the overlaying metal runners, are indicated by a dash line, inscribed within the respective contact diffusion profile area indicated by the dash and point line.

Figure 2:
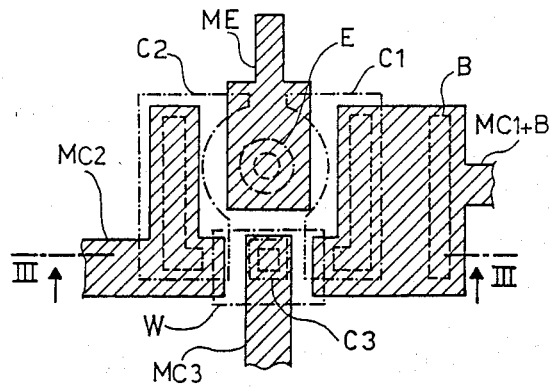
FIG. 2 is a schematic plan view of an integrated structure of the two PNP transistors of the circuit of FIG. 1.

The base, n-type region, common for both transistors, may be the epitaxial layer (EPI) itself, wherein a heavier doped n+ region coinciding with the base contact area (indicated by the B letter in FIG. 1), is commonly produced by implantation. The emitter, p-type region E is obtained by diffusion in a central zone of the integrated structure, being such an emitter region common for both transistors T1 and T2. The relative emitter contact is made in a concentric position with respect to the diffused emitter region and is indicated by a dash line, below the respective contacting metal indicated by the hatched are $M_E$. The two, p-type diffused collector regions C1 and C2, belonging to transistor T1 and T2, respectively, may be formed, as shown in FIG. 2, by diffusing the dopant in areas adjacently surrounding the common emitter region E. The respective collector contact areas are indicated by a dash line below the relative contacting metals $M_{C1}$ and $M_{C2}$, which are indicated by the respective hatched areas in FIG. 2.

Of course, the collector contacting metal $M_{C1}$ is common both for the C1 collector contact of transistor T1 and for the base contact B, which is common for both transistors T1 and T2 and the unique metal runner is indicated as $M_{C1}+B$ in the figures. In an integrated structure of this kind, the output current $I_{OUT}$ depends on the current which is imposed by the current generator Io and on the ratio between the collector areas C1 and C2 belonging to the two transistors, respectively. With the objective of adjusting this area ratio, a secondary collector, p-type diffused region C3 is purposely formed in a position which is adjacent to at least one of the two primary collector regions C1 and C2 and, more preferably, in a position which is adjacent to both. The area of such a secondary collector diffused region C3 is a small fraction of the area of the two primary collector diffused regions C1 and C2. The secondary collector region C3 is contacted by a dedicated metal MC3, which runs to a contact pad, not shown in the figure.

This secondary, p-type diffused collector region C3 may be functionally added to the primary, p-type diffused, collector region belonging to one or the other of the two transistors of the integrated structure in order to adjust the ratio between the collector areas of the two transistors T1 and T2. In other words, it is possible to incrementally increase the collector area of a lateral PNP transistor during an electrical testing step on wafer, by adding to the designed collector area of the transistor the area of a secondary collector region which is purposely formed adjacently to the area of the primary collector. The union of the two diffused collector regions is achieved by causing a permanent shortcircuiting connection between the respective contacting metals, by means of a known technique which is commonly referred to as "Zener zapping". Utilizing such a known technique, during an electric testing step on wafer of the integrated circuits being fabricated, an electrical current is forced to pass between the primary collector contact of the transistor of which the collector area must be incrementally increased by adding to it the area of a secondary, p-type diffused, collector region, and the contact pad which is connected to such a secondary collector region, by applying a voltage of about 25–50 V thereacross. As it is known, by inversely biasing the base-collector junction at such a voltage level, the breakdown of the junction occurs at its $BV_{EBO}$ breakdown voltage and a localized power dissipation occurs in the silicon which causes the melting of adjacent contacting metals at the silicon/metal contact interface and a transfer of molten metal along the oxide-silicon interface, thus creating a metal "whisker" which permanently shortcircuits the two contacting metals though remaining substantially insulated from the adjacent silicon. The effect of this "Zener zapping" procedure is depicted in FIG. 3, which represents a schematic, cross section elevation view of the integrated structure shown in FIG. 2, along the section plan III-III of the latter.

Figure 3:
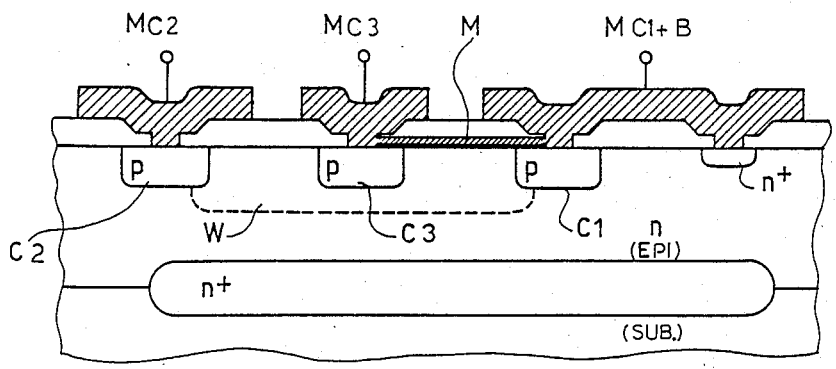
FIG. 3 is an elevation, cross section view of the structure of FIG. 2 taken along the section plane III—III.

As it may be observed in FIG. 3, by forcing voltage and current across the secondary p-diffused C3 region's contacting metal MC3 and the contacting metal MC1 + B of the primary collector p-diffused region C1 of the transistor T1, a permanent connection between the two metals through a thin metal whisker M which forms directly under the insulating $SiO_2$, though remaining substantially isolated from the underlaying silicon.

Naturally, if it is desired to modify in a contrary manner the ratio between the respective collector areas C1 and C2 of the two transistors of the integrated structure, the auxiliary collector region C3 may be functionally added to the primary collector region C2 of transistor T2 by producing a permanent connection between the respective metals by means of an entirely identical procedure to the one described for transistor T1. Where necessary, also the contacting metals of the two primary collectors may be connected to suitable contact pads for performing the "Zener zapping". With the aim of favoring the formation of such a permanent connection between a primary collector region and a secondary, fractional area collector region, purposely formed near the primary region, by means of the so-called "Zener zapping" technique, and especially when the base region of the integrated structure has a particularly low doping level, in a superficial region of the silicon directly underneath the zone where the permanent electrical connection could be formed by migration of molten metal between the two diffused collector regions, a purposely increased doping level may be established with respect to the bulk of the base region. This doping enhancement may be made by implantation and subsequent diffusion of the specific dopant. Such a "adjustment" of the doping level of the base region directly underneath the zone where will be eventually produced the shortcircuiting connection by the "Zener zapping" technique, is depicted in the cross section view of FIG. 3 and in the plan view of FIG. 2 by indicating the n-type enhanced doping profile by the dash line W.

Figure 4:
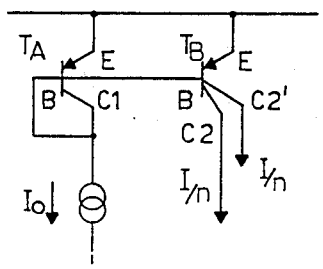
FIG. 4 shows another type of circuit for generating a plurality of currents having a preset ratio among them.
Figure 5:
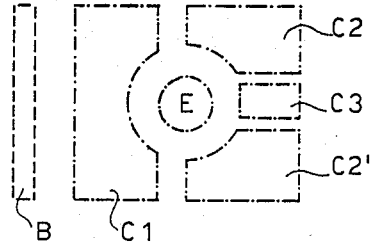
FIG. 5 is a schematic plan view of the integrated structure of the two PNP transistors used in the circuit of FIG. 4.

A further example of implementation of the method of the present invention is shown schematically in FIGS. 4 and 5. The current generating circuit shown in FIG. 4 is another widely used circuit for producing two or more output currents I/n of a preset ratio among the latters, in function of a current imposed by the current generator Io. The circuit utilizes two lateral PNP transistors : TA and TB, in a similar configuration to that of the two transistors T1 and T2 of the circuit of FIG. 1, and wherein the output transistor TB is provided with multiple collectors: C2, C2' . . . etc.. The ratio among the output currents I/n depends on the area ratio among the distinct collectors of the output transistor TB.

In FIG. 5, the plan view arrangement of the distinct diffused regions constituting the integrated structure is schematically depicted. These diffused regions are indicated respectively by the same letters already used in FIG. 4 for indicating the respective terminals of the two transistors TA and TB of the structure. A secondary, p-type diffused collector region C3 having fractional dimensions in respect to the dimensions of the two primary p-type diffused collector regions C2 and C2' of the multi-collector output transistor TB, is formed, in accordance with the present invention, in a position adjacent to two primary collector regions of the output transistor. The ratio between the areas of the two distinct collectors C2 and C2' of the output transistor TB may be adjusted, during an electrical testing step on wafer of the integrated circuit being fabricated, by adding, if necessary, the secondary collector region C3 to either one or the other of the two primary collector regions C2 and C2', by utilizing the same "Zener zapping" technique already described. Also in this case the considerations made for the preceding examples, in relation to the arrangement of the contacting metals of the various silicon regions of the integrated structure and in relation to a possible adjustment of the doping level of the base region of the integrated structure in the specific zones as discussed above, will equally apply.

What we claim is:

1. A method for incrementally increasing during an electric testing step, directly on wafer, the collector area of a lateral PNP transistor of an integrated device, said transistor having a diffused, p-type, primary collector region contacted by a collector metal, comprising the steps of:

forming a diffused p-type secondary collector region having substantially fractional dimensions with respect to the dimensions of said primary collector region and adjacently thereto;

said secondary collector region being contacted by a metal which electrically connects said secondary collector region to a contact pad of the integrated device;

joining said secondary collector region to said primary collector region to form a resulting collector region having an area which is incrementally increased by the area of said secondary collector region by permanently shortcircuiting the respective metals by forcing the passage between said respective metals of an electric current across the reversely biased base-collector junction of the PNP transistor having a value sufficient for the localized power dissipation to cause the localized melting of the metal at the adjacent metal-semiconductor contact interfaces and a migration of the locally melted metal to form a permanent connecting metal whisker between said two respective metals.

2. A method for incrementally adjusting, during an electric testing step on wafer of an integrated device, the ratio among different collector areas of an integrated current output structure of lateral PNP transistors, said structure having a common p-type diffused emitter region, a common base region and a plurality of primary, p-type diffused collector regions each being contacted through a respective contacting metal, comprising the steps of:

forming at least a secondary, p-type diffused, collector region having substantially fractional dimensions with respect to the dimensions of said primary collector regions in an intermediate position with respect to at least two adjacent primary collector regions;

contacting said secondary collector region by means of a metal electrically connected to a contact pad of the integrated device; and joining said secondary collector region to one of said adjacent primary collector regions to form a collector region having an area which is incrementally increased by the area of said secondary collector region, by permanently shortcircuiting the respective metals by forcing the passage between said respective metals of an electric current across the chosen reversely biased base-collector junction of said integrated structure having a value sufficient for the localized power dissipation to cause the localized melting of the metal at the adjacent metal - semiconductor contact interfaces and a transfer of the locally melted metal to form a permanent electrical connection between the two respective metals.

* * * * *